United States Patent
Chen et al.

(10) Patent No.: US 7,560,957 B2
(45) Date of Patent: Jul. 14, 2009

(54) HIGH-SPEED CML CIRCUIT DESIGN

(75) Inventors: Jinghong Chen, Basking Ridge, NJ (US); Gregory W. Sheets, Breingsville, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 40 days.

(21) Appl. No.: 11/421,675

(22) Filed: Jun. 1, 2006

(65) Prior Publication Data

US 2007/0018694 A1      Jan. 25, 2007

Related U.S. Application Data

(60) Provisional application No. 60/698,375, filed on Jul. 12, 2005.

(51) Int. Cl.
*H03K 17/16* (2006.01)
*H03K 19/003* (2006.01)
*H03K 19/0175* (2006.01)
*H03K 19/20* (2006.01)
*H03K 19/094* (2006.01)

(52) U.S. Cl. .......... 326/115; 326/82; 326/112; 326/21; 326/26

(58) Field of Classification Search .......... None
See application file for complete search history.

(56) References Cited

U.S. PATENT DOCUMENTS

| | | | |
|---|---|---|---|
| 5,295,161 A | 3/1994 | Dreps et al. | |
| 6,433,612 B1 | 8/2002 | Jenkins | |
| 6,489,811 B2 | 12/2002 | Jenkins | |
| 6,674,328 B2 | 1/2004 | Uto et al. | |
| 6,686,787 B2 | 2/2004 | Ling | |
| 6,710,645 B2 | 3/2004 | Isken et al. | |
| 6,777,988 B2 | 8/2004 | Tung et al. | |
| 6,825,707 B2 | 11/2004 | Viehmann et al. | |
| 6,897,700 B1 | 5/2005 | Fu et al. | |
| 6,903,593 B2 | 6/2005 | Wang | |
| 6,937,083 B2 | 8/2005 | Manlove et al. | |
| 6,968,172 B2 | 11/2005 | Saito | |
| 7,154,294 B2 | 12/2006 | Liu et al. | |
| 7,202,706 B1 * | 4/2007 | Plasterer et al. | 326/127 |

(Continued)

FOREIGN PATENT DOCUMENTS

JP      07240640 A      9/1995

OTHER PUBLICATIONS

Jinghong Chen et al., Agere Systems, Allentown, PA and Jenshan Lin, Dept. of Electrical Engineering, University of Florida, Gainesville, FL, "Electrical Backplane Equalization Using Programmable Analog Zeros and Folded Active Inductors," 0-7803-9197-7/05 © 2005 IEEE, pp. 1366-1369.

(Continued)

*Primary Examiner*—Rexford Barnie
*Assistant Examiner*—Matthew C Tabler

(57) ABSTRACT

A current mode logic digital circuit is provided comprising a logic circuit component having at least one data input node and at least one output node. A load is coupled between a power supply node and the output node. The load comprises a folded active inductor coupled to the output node.

17 Claims, 8 Drawing Sheets

U.S. PATENT DOCUMENTS

| | | |
|---|---|---|
| 7,259,616 B2 | 8/2007 | Chang |
| 7,271,649 B2 | 9/2007 | Chiu et al. |
| 7,388,406 B2 | 6/2008 | Chen |
| 2003/0141912 A1 | 7/2003 | Sudjian |
| 2004/0100307 A1 | 5/2004 | Wong et al. |
| 2004/0140831 A1* | 7/2004 | Wang .................... 327/115 |
| 2004/0227573 A1* | 11/2004 | Soda .................... 330/253 |
| 2004/0233183 A1 | 11/2004 | Saeki |
| 2006/0077003 A1 | 4/2006 | Chiu et al. |
| 2006/0186954 A1 | 8/2006 | Koller et al. |

OTHER PUBLICATIONS

Office Action received for U.S. Appl. No. 11/420,098 dated Oct. 4, 2007.
Notice of Allowance dated Apr. 4, 2008 in U.S. Appl. No. 11/420,098.
Office Action dated Jan. 9, 2008 in U.S. Appl. No. 11/420,177.
Peter R. Kinget, "Device Mismatch and Tradeoffs in the Design of Analog Circuits," IEEE Journal of Solid-State Circuits, vol. 40, No. 6, Jun. 2005, pp. 1212-1224.
Eduard Sackinger, "Broadband Circuits for Optical Fiber Communication," E-book published May 2005, Publisher: John Wiley & Sons, 2 page excerpt.

* cited by examiner

10

10A

10B

100

300

400

HIGH-SPEED CML CIRCUIT DESIGN

CROSS-REFERENCE TO RELATED APPLICATION

This application claims priority to U.S. Provisional Patent Application Ser. No. 60/698,375 filed Jul. 12, 2005 and entitled "Electrical Backplane Equalization Using Programmable Analog Zeros And Folded Active Inductors", the entirety of which is hereby incorporated by reference herein.

FIELD OF THE INVENTION

The present invention relates generally to logic circuits and more particularly to high speed current mode logic circuits.

BACKGROUND OF THE INVENTION

When high-speed and low voltage swing data transfer is needed, differential signaling (also commonly referred to as double ended signals) is perhaps the most robust and promising signaling concept. Differential signaling can add an additional measure of noise immunity due to the fact that the transmitted signal is carried on two conductors and is the difference of the two signals on the two conductors. Current mode logic (CML), a design technique commonly used in high speed signaling applications such as high-speed data communication systems, communications chips and routers, uses differential signaling.

Current-mode-logic (CML) circuits have been widely used in high-speed data communication systems due largely in part to improved switching speeds when compared with voltage-mode-logic circuits. CML circuits can operate with low signal voltages and higher operating frequencies at lower supply voltages than static CMOS circuits. CML is also widely used in high-speed applications due to its relatively low power consumption and low supply voltage when compared to other types of logic designs, such as emitter coupled logic (ECL). CML is also considerably faster than CMOS due to its lower voltage swings.

CML has an additional advantage over other high-speed forms of logic such as logic using Gallium Arsenide (GaAs) in that CML can be fabricated using the same fabrication lines as the widely used CMOS circuits, thus allowing CML circuits to be created on high-technology fabrication lines without requiring a significant outlay of money to create a special fabrication line. Additionally, CML logic may cohabitate with CMOS logic on the same integrated circuit. Therefore, such hybrid circuits can combine the high-speed aspects of CML logic and the low power requirements of CMOS logic.

While CML has been widely used in high-speed data communication systems, even with current state-of-the-art CMOS technology, it is still challenging to design CML based logic circuits for today's higher speed data communication applications, e.g., for 10 Gb/s (Giga-bits per second) and beyond data communications. Various approaches have been proposed for increasing the switching speeds of CML based logic circuits, the speeds of which are generally limited by parasitic capacitances as well as loading capacitances present in the circuits. Examples of such techniques include spiral inductor shunt peaking or active inductor shunt peaking. The use of a conventional spiral inductor for shunt peaking, however, occupies excessive amounts of chip area. CML circuits with conventional active inductor shunt peaking require additional on-chip high voltage generation circuitry, which makes the design more complex and also consumes chip area.

Therefore, there remains a need for a technique for enhancing switching speeds in CML circuit, and particularly for techniques that conserve chip area and/or that do not require additional high voltage generation circuitry.

SUMMARY OF THE INVENTION

A current mode logic digital circuit is provided comprising a logic circuit component having at least one data input node and at least one output node. A load is coupled between a power supply node and the output node. The load comprises a folded active inductor coupled to the output node.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

An improved inductive shunt peaking technique is described herein for enhancing the speed of CML based logic circuits. The proposed inductive shunt peaking technique can at least partially absorb or offset parasitic capacitances inherent in CML logic circuits as well as loading capacitances, thus increasing the rise/fall speed of the output signals. Specifically, folded active inductor loads are proposed for use in CML circuit designs. The technique is described herein in connection with a MOS CML data multiplexer (MUX) circuit and a MOS CML D flip-flop, but it should be understood that the loading technique is equally applicable to other CML logic circuits such as CML buffers, CML AND gates, CML OR gates, CML latches, and other CML circuits used in high speed data communication circuitry or other high speed applications. The structures of these logic circuits are not each described herein but are readily familiar to those skilled in the art of circuit design.

As those in the art will understand, the standard MOS CML structure, whether MUX circuit, AND gate, data latch, etc., comprises three main parts: the pull up resistors, the pull down network switch and the current source. The inputs to the pull down network are fully differential. The pull down network can implement any logic function (MUX, AND, OR, XOR, etc.) but must have a definite value for all possible input combinations. The pull down network is regulated by a constant current source commonly referred to as the tail current source. The pull down network steers the current from the current source to one of the pull up resistors based upon the implemented logic function. The resistor connected to the current source through the pull down network will have current flowing therethrough, causing a voltage drop, whereas the other resistor will not have any current flowing through its output node and will be pulled up to VDD. The output swing is set exclusively by the amount of current and the value of the resistor load and is generally much smaller than VDD, in the order of a few hundred millivolts.

Figure 1:
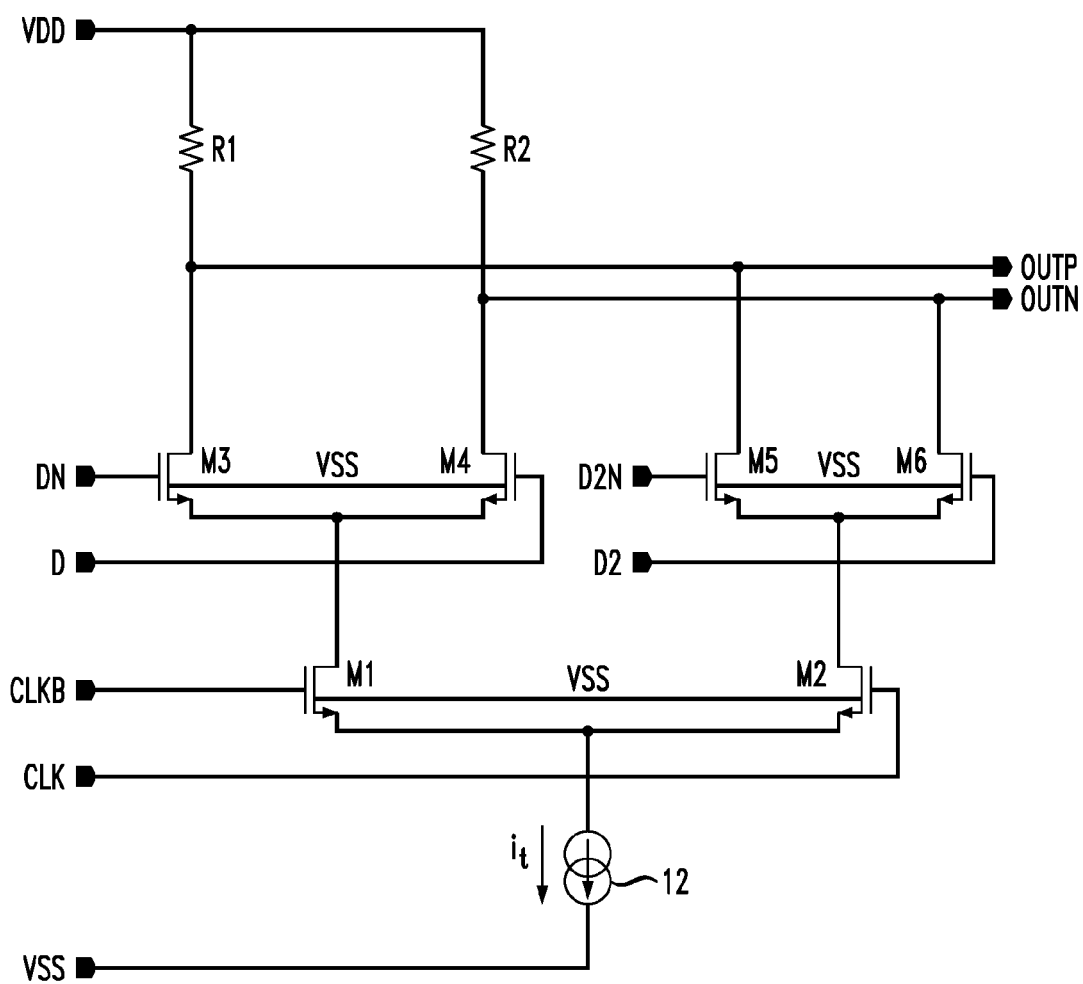
FIG. 1 is circuit diagram of a CML 2:1 multiplexer having a prior art resistor load.

FIG. 1 is a circuit diagram of a conventional CML 2:1 MUX circuit 10 having a prior art resistor load. The MUX has two differential outputs, positive output OUTP and negative output OUTN. Resistors R1 and R2 form resistive loads coupled between the supply rail voltage VDD and the output nodes OUTP and OUTN, respectively. In one example, the MUX is fabricated using 0.13 μm MOS technology where VDD is 1.0V. Resistors R1 and R2 typically comprise doped polysilicon strips. The resistive values of R1 and R2 are used to set the common mode voltage along with the tail current value set by constant current source 12. VSS in this circuit is set to ground.

MUX 10 includes a first differential pair of NMOS transistors M3 and M4 and a second differential pair of NMOS transistors M5 and M6. The first differential pair M3, M4 is selected for operation, that is coupled to current source 12, through NMOS selection transistor M1 when clock bar (CLKB) is high. The second differential pair M5, M6 is selected for operation through NMOS selection transistor M2 when clock (CLK) is high. A first data signal D is coupled to the gate input of M4, and first data not signal DN is coupled to the gate input of M3. A second data signal D2 is coupled to the gate input of M6, and second data not signal D2N is coupled to the gate input of M5.

The operation of the multiplexer 10 is now described. Assume CLKB is high and CLK is low. CLKB turns on selection transistor M1, connecting current source 12 to first differential pair M3, M4. Selection transistor M2 is off, disconnecting second differential pair M5, M6 from the circuit. The resistance values of R1, R2 and the current value of constant current $i_t$ from tail current source 12 set the common mode voltage of the circuit. In one example, if VDD is 1.0V and $i_t/2*R$ is set to 0.2V where "R" is the resistance value of R1 or R2, then the output common-mode voltage is 0.8V. In this embodiment, if the tail current it is 2.0 mA, then R equals 200 Ω. Assume DN input to M3 is high and D input to M4 is low. In this case, M3 is on. Output OUTP is set to VDD−$i_t*R$ or 0.6V. In this case, M4 is off, meaning no current flows through resistor R2, and the voltage at OUTN is set to VDD, i.e., 1.0V. In this case, the single-ended output swing is 0.4V (e.g., 1.0V−0.6V=0.4V).

With the circuit of FIG. 1, parasitic capacitances (e.g., capacitances inherent in CML logic circuits and metal routing capacitances) as well as loading capacitance (e.g., next stage load capacitance) exist between node OUTP and ground and between node OUTN and ground. These capacitances slow down the switching speed of the circuit as the capacitances take time to charge and discharge during the output voltage swing.

Figure 2:
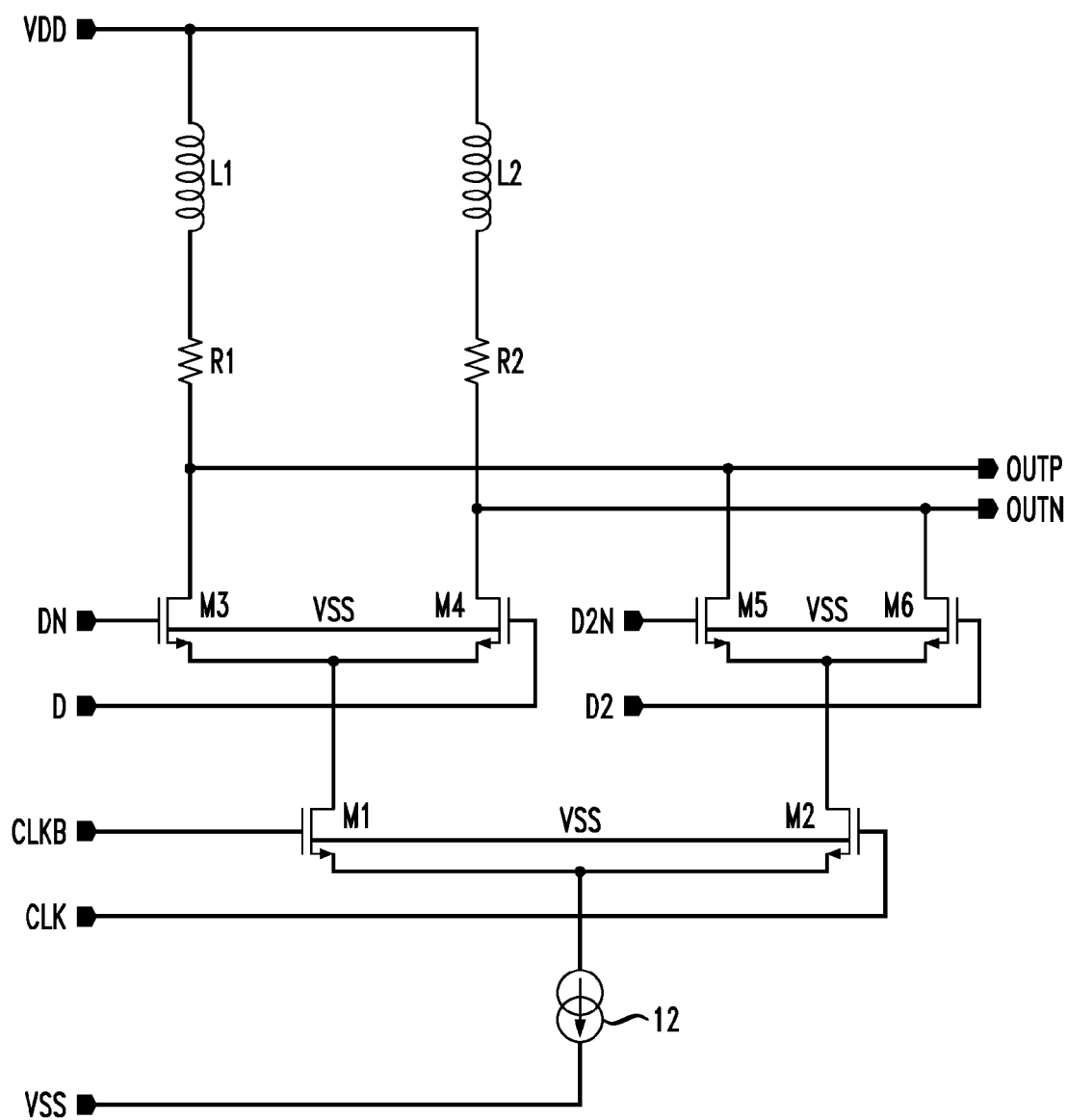
FIG. 2 is a circuit diagram of a CML 2:1 multiplexer having a prior art spiral inductor shunt packaging load.

FIG. 2 is a circuit diagram of a conventional CML 2:1 MUX circuit 10A having prior art spiral inductor loads L1 and L2 added in series with the resistive loads R1 and R2 of FIG. 1. As those in the art will understand, the spiral inductor loads L1 and L2 are sized to cancel out the capacitive effects of the aforementioned parasitic as well as loading capacitances, making the switching speed of the circuit 10A faster than the switching speed of circuit 10. Although providing improved switching speed, the spiral inductive loads L1 and L2 consume large and often intolerable amounts of chip area. Spiral inductors are rarely smaller than 100 μm×100 μm.

Figure 3:
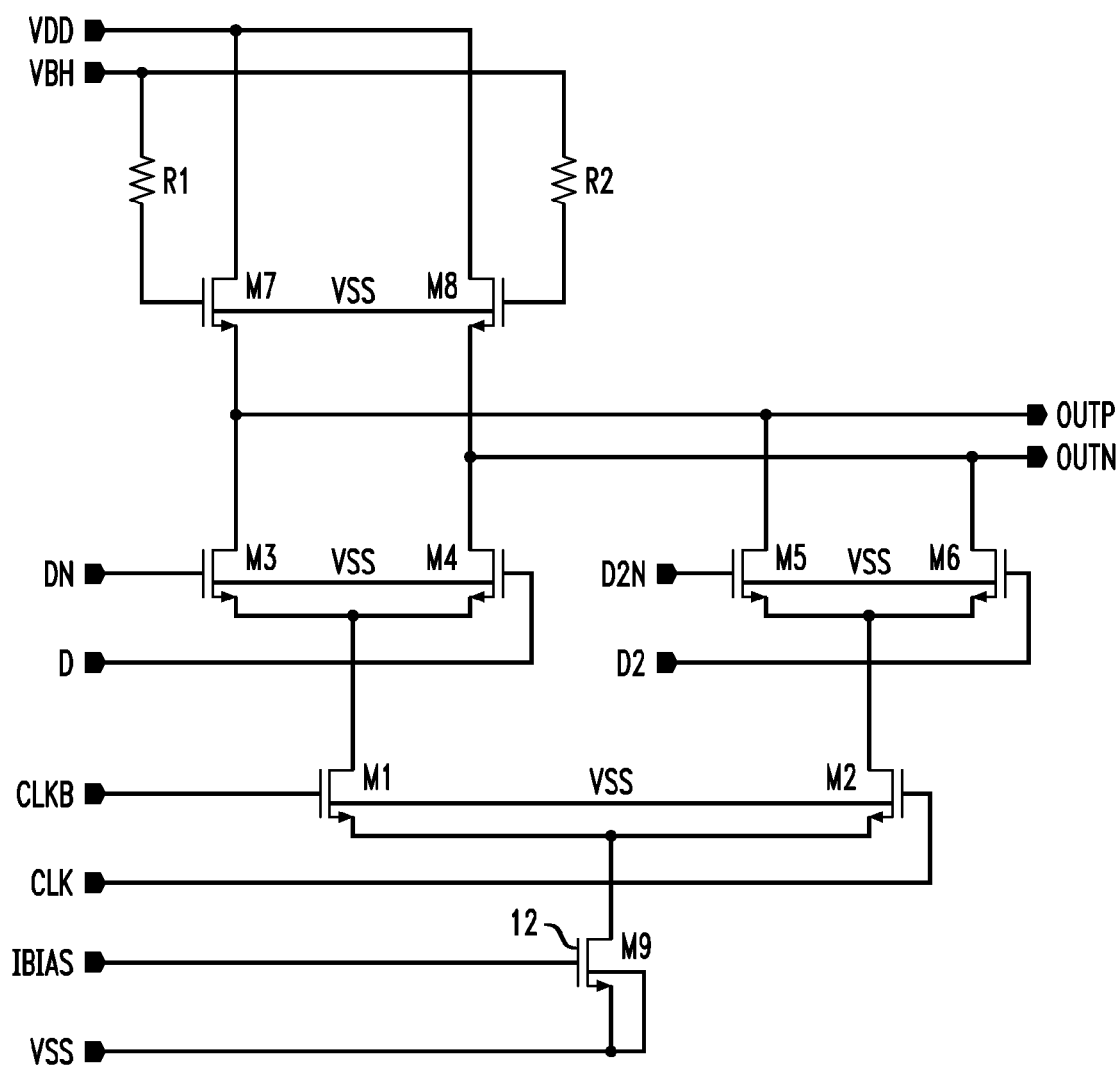
FIG. 3 is a circuit diagram of a CML 2:1 multiplexer having a prior art active inductor load.

Turning to FIG. 3, FIG. 3 is a circuit diagram of a conventional CML 2:1 MUX circuit 10B having a prior art active inductive load. MUX 10B is identical to MUXs 10 and 10A except for the active inductive load. Tail current source 12 is shown as a NMOS transistor M9 coupled between the common source terminals of selection transistors M1, M2 and VSS. Tail current transistor M9 is biased at its gate terminal by signal IBIAS and is sized to provide about 2.0 mA of tail current in one embodiment. The bias current is often generated by a diode-biased current mirror with the reference current generated from a bandgap circuit.

The active inductor loads do not include the area-consuming spiral inductors found in circuit 10A. Rather, NMOS transistors M7 and M8 are coupled, respectively, between VDD and nodes OUTP and OUTN. Resistor loads R1 and R2 are coupled between the gate terminals of transistors M7 and M8, respectively, and voltage node VBH. Voltage VBH is higher (e.g., 1.4V) than voltage VDD (e.g., 1.0V). This is due to the large dc voltage drop (e.g., the gate-to-source voltage VGS of transistors M7 and M8) which is enlarged by the body effect (e.g., the source-to-substrate voltage is not zero).

The active inductor load shown in FIG. 3 (e.g., M7 and R1, or M8 and R2) behaves like an inductor for small signals. The active inductors absorb the capacitances at the output nodes of circuit 10B, as in the case of the spiral inductive loads of circuit 10A, but without consuming the large amounts of area needed for spiral inductor loads. The circuit 10B, however, does suffer from several drawbacks. One of the drawbacks of conventional active inductors is the large dc voltage drop caused by the NMOS threshold voltage across the load transistors (e.g., M7 and M8), which is enlarged by the body effect. The voltage drop (e.g., the VGS of transistors M7 and M8) can be well above 0.6V, creates a headroom problem in 1.0V technology. If VBH is not tied to a high voltage but to VDD, then the output common mode voltage $V_{CM}$ is only 0.4V (e.g., VBH −VGS=1.0V -0.6V=0.4V). The output common mode voltage however needs to be large enough to ensure that the NMOS transistors (transistors M3, M4, M1, and M9 when CLKB is high; and transistors M5, M6, M2 and M9 when CLK is high) operate in saturation mode. To meet this requirement, the output common mode voltage needs to satisfy the following equation:

$$V_{CM} \geq V_{TH\text{-}NMOS} + 2V_{DSAT\text{-}NMOS}. \qquad (1)$$

In EQ. (1), $V_{TH\text{-}NMOS}$ is the threshold voltage of the NMOS transistor and is typically about 0.4 to 0.5V in a deep submicron technology. Voltage $V_{DSAT\text{-}NMOS}$ is the saturation drain-to-source voltage of the NMOS transistor and is typically around 0.15 to 0.2V. As a result, a $V_{CM}$ of about 0.7 to 0.8V is desired. Assume $V_{CM}$ is 0.8V and the gate-to-source voltage drop (e.g., VGS) of transistors M7 and M8 is 0.6V, then VBH needs to be set at about 1.4V (e.g., 0.8V+0.6V=1.4V). Generation of the high voltage VBH requires additional circuitry (not shown) such as charge pumps. This voltage generating circuitry consumes more chip area and adds design complexity.

Still further, for the active inductors shown in FIG. 3, the threshold voltage (Vth) variation of the NMOS transistor across process-voltage-temperature (PVTs) results in a large variation of the dc gate-to-source voltage drop across the load transistors M7 and M8, which makes the output common mode voltage $V_{CM}$ not well controlled. To stabilize the output common-mode voltage, a common-mode-feedback (CMFB) circuit often is needed. The design of the CMFB circuit adds design complexity and consumes more area.

Figure 4:
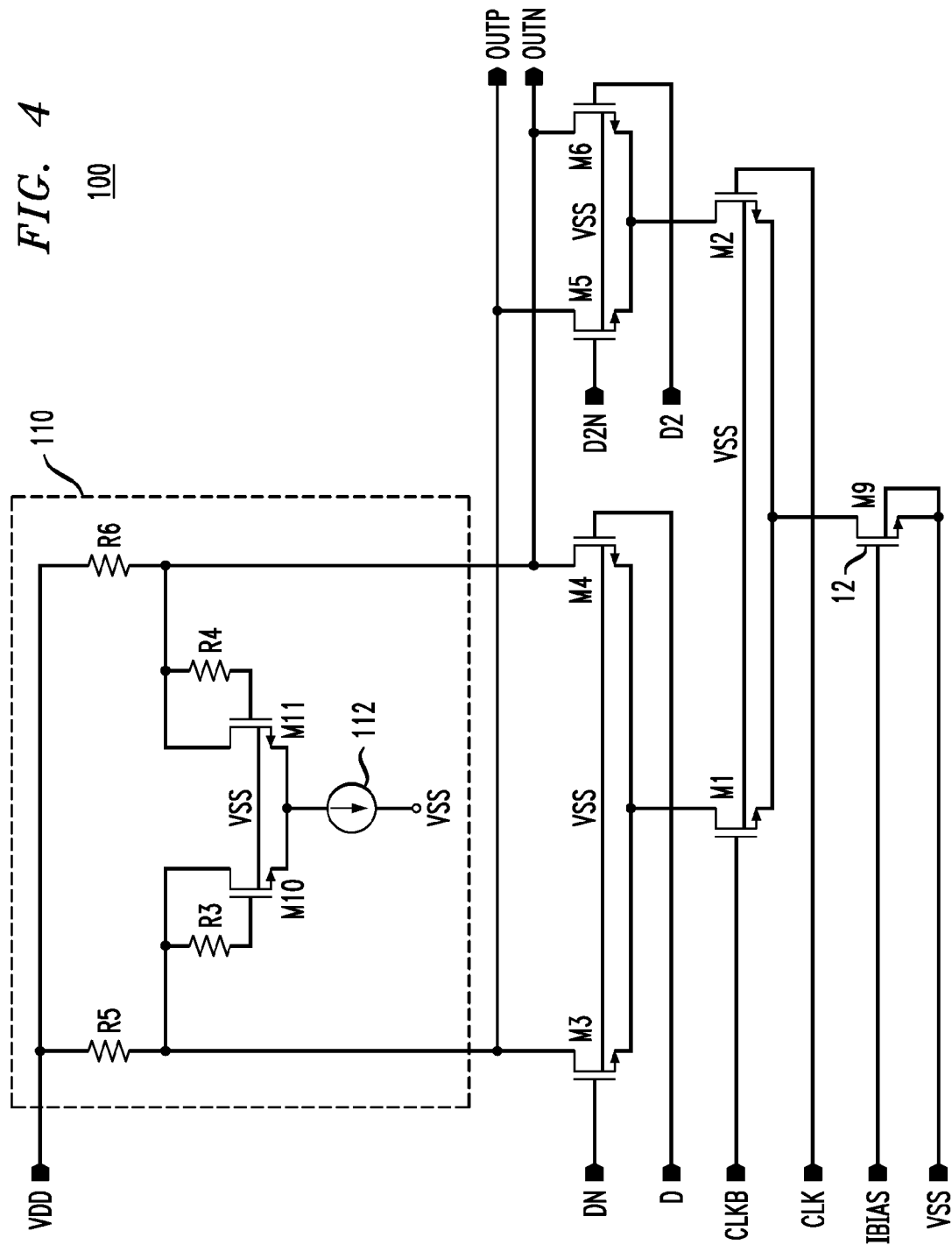
FIG. 4 is a circuit diagram of a CML 2:1 multiplexer according to the present invention having a folded active inductor load.

Turning now to FIG. 4, a circuit diagram is provided of a multiplexer 100. The design of the multiplexer 100 is the same as prior art multiplexers 10, 10A and 10B shown in FIGS. 1-3, and like features are shown with like reference numbers, except that multiplexer 100 includes an improved load 110 having folded active inductors.

Load 110 includes pull up resistors R5 and R6 coupled between supply rail VDD and the output nodes. A pair of folded active inductors is coupled to the output nodes. Each folded active inductor comprises a resistor R3 or R4 and an NMOS transistor M10 or M11. Resistors R3 and R4 are coupled between pull up resistors R5 and R6 and the gate nodes of NMOS transistors M10 and M11, respectively. The drain terminals of M10 and M11 are also coupled to pull up resistors R5 and R6, respectively. The common source nodes of transistors M10 and M11 are coupled to constant current source 112, which preferably comprises an NMOS transistor. The common current source is coupled to VSS. Essentially, R5 and R6 have resistance values similar to the resistor loads of R1 and R2. Resistors R3 and R4, NMOS transistors M10 and M11 and the current source 112 are added to form the folded active inductor.

The signal behavior/model for the folded active inductor load 110 is briefly discussed herein and detailed model development is provided in Jinghong Chen, et al. "Electrical Backplane Equalization Using Programmable Analog Zeros and Folded Active Inductors," the entirety of which is hereby incorporated by reference herein (Pages: 1366-1369, 48th IEEE Midwest Symposium on Circuits and Systems, Aug. 7-10, 2005). The impedance of the folded active inductor can be calculated as:

$$Z_{in} = R_{load} // \left(R_f + \frac{1}{sC_{gs}}\right) // \frac{1}{g_m \frac{sC_{gs}}{R_f + \frac{1}{sC_{gs}}}} \quad (2)$$

$$= Z_{in}$$

$$\approx R_{load} // \frac{1}{g_m} \frac{1 + sC_{gs}R_f}{1 + sC_{gs}\frac{1}{g_m}}$$

In EQ. (2), $g_m$ denotes the small-signal trans-conductance of transistors M10 and M11, $R_{load}$ denotes the resistance value of resistors R5 and R6, and $R_f$ denotes the resistance value of resistors R3 and R4. The impedance $Z_{in}$ provides a zero and a pole and has an inductor characteristic. At low frequency $Z_{in} \approx R_{load}//1/g_m$; at high frequency $Z_{in} \approx R_{load}//R_f$.

The parasitic capacitances (e.g., capacitance inherent in CML logic circuits and metal routing capacitance) as well as loading capacitance (e.g., next stage load capacitance) at the output node are denoted as $C_{load}$. Then, considering $C_{load}$, the output impedance of the CML multiplexer circuit shown in FIG. 4 becomes:

$$Z_{in} = R_{load} // \left(R_f + \frac{1}{sC_{gs}}\right) // \frac{1}{g_m \frac{sC_{gs}}{R_f + \frac{1}{sC_{gs}}}} // \frac{1}{sC_{load}} \quad (3)$$

Figure 6:
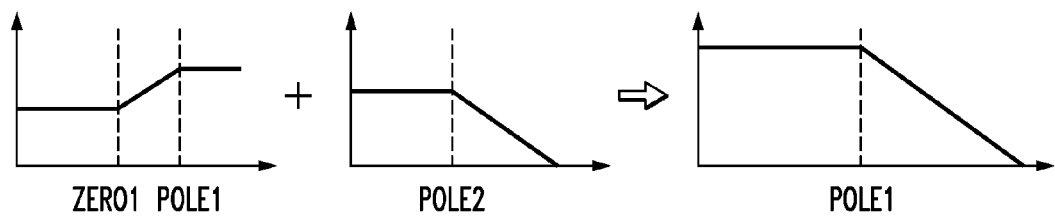
FIG. 6 graphically illustrates pole-zero cancellation of a folded active inductor shunting peaking load.

The transfer function of $Z_{in}$ now has one zero and two poles—zero1 and pole1 from the added folded active inductor, and pole2 due to $C_{load}$. The goal of the folded-active-inductor load is to provide the zero (e.g., zero1) in the $Z_{in}$ transfer function to alter the effect of the pole due to $C_{load}$ (e.g., pole2). In the folded active inductor load shown in FIG. 4, the trans-conductance of the transistors M10 and M11 (e.g., the transistor size of M10 and M11 and the current of tail current source 112) and the resistance value of resistors R3 and R4 are designed so that zero1 can be equal to pole2 as is graphically shown in FIG. 6. Doing so extends the circuit bandwidth, thus enabling the CML circuit to operate at a higher speed. With zero1 canceling out pole2, the CML circuit with the folded active inductor load now has a pole at pole1 which is much large than pole2 (e.g., a higher bandwidth thus a higher operation speed). For the CML multiplexer circuit shown in FIG. 4, when designed in a Taiwan Semiconductor Manufacturing Company (TSMC) 0.13 μm CMOS technology and operated at a 5 Gb/s data rate, assume $C_{load}$=100fF, then the resistor value of R3 and R4 can be set at 2 KΩ, tail current 112 is set at 0.5 mA, and the transistors M10 and M11 are sized at 20 μm/0.13 μm. The zero provided by such a folded active inductor design can cancel out the pole due to $C_{load}$.

Referring again to FIG. 6, folded active inductor introduces a zero which cancels out the pole due to the capacitance (the inherent parasitic capacitance as well as the loading capacitance) at the CML circuit output node. Such a pole-zero cancellation extends the bandwidth of the CML circuit enabling the circuit to operate at higher speeds.

Figure 7:
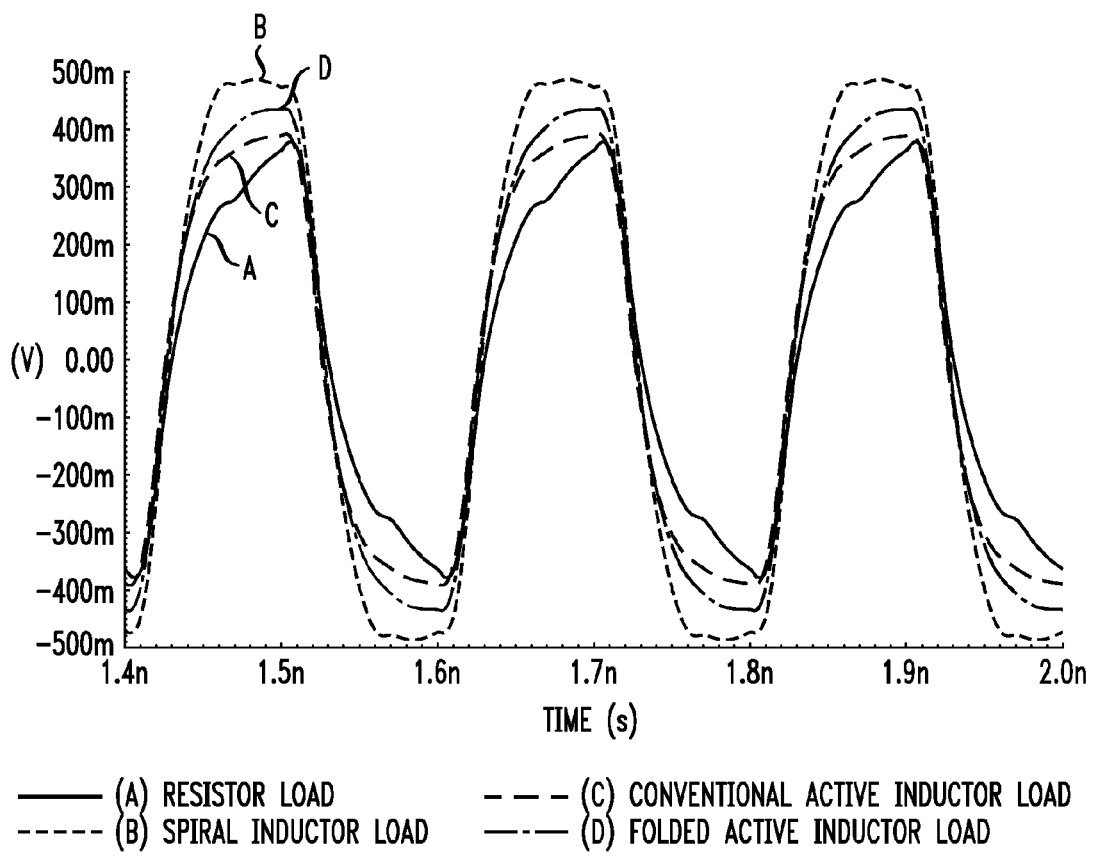
FIG. 7 illustrates simulations results for the CML multiplexer circuits of FIGS. 1-4 in terms of transition time.

FIG. 7 compares simulation results of the CML multiplexer circuits of FIGS. 1 to 4 in terms of the transition time (time required to transition between the 10% and 90% points of the full range). In the simulation, the capacitance $C_{load}$ is set at 100 fF. The data rate of the input signals is set at 5 Gb/s. The simulated transition time of the resistor load multiplexer (e.g., FIG. 1) is 77.32 ps. The simulated transition time of the spiral inductor load multiplexer (e.g., FIG. 2) is 46.42 ps, which is about 60% of that of the resistor load multiplexer circuit. The simulated transition time of the conventional active inductor load multiplexer circuit (e.g., FIG. 3) is 54.71 ps, which is about 70.7% of that of the resistor load multiplexer circuit. Finally, the simulated transition time of the proposed folded active inductor load multiplexer circuit (e.g., FIG. 4) is 55.17 ps, which is about 71.3% of that of the resistor load multiplexer circuit.

The load 110 including folded active inductors, like the inductive loads of FIGS. 2 and 3, helps to improve the switching speed of the CML circuit by offsetting parasitic capacitances in the circuit. Although the overall device performance is similar in the circuits of FIGS. 3-4 as shown in the simulations below, large voltages can be provided across the gate and source of the NMOS transistors in the folded active inductor loads without causing headroom problems associated with conventional active inductors. The common-mode voltage is also well maintained as it is not dependent upon the gate-to-source dc voltage drop across load transistors, which may vary PVTs. The entire circuit can also be operated with a 1.0V supply without the need for any high voltage generation circuit. The folded active inductor, therefore, not only consumes lower voltage headroom but also is area-efficient, compared to the conventional active and on-chip inductors, respectively.

Figure 5:
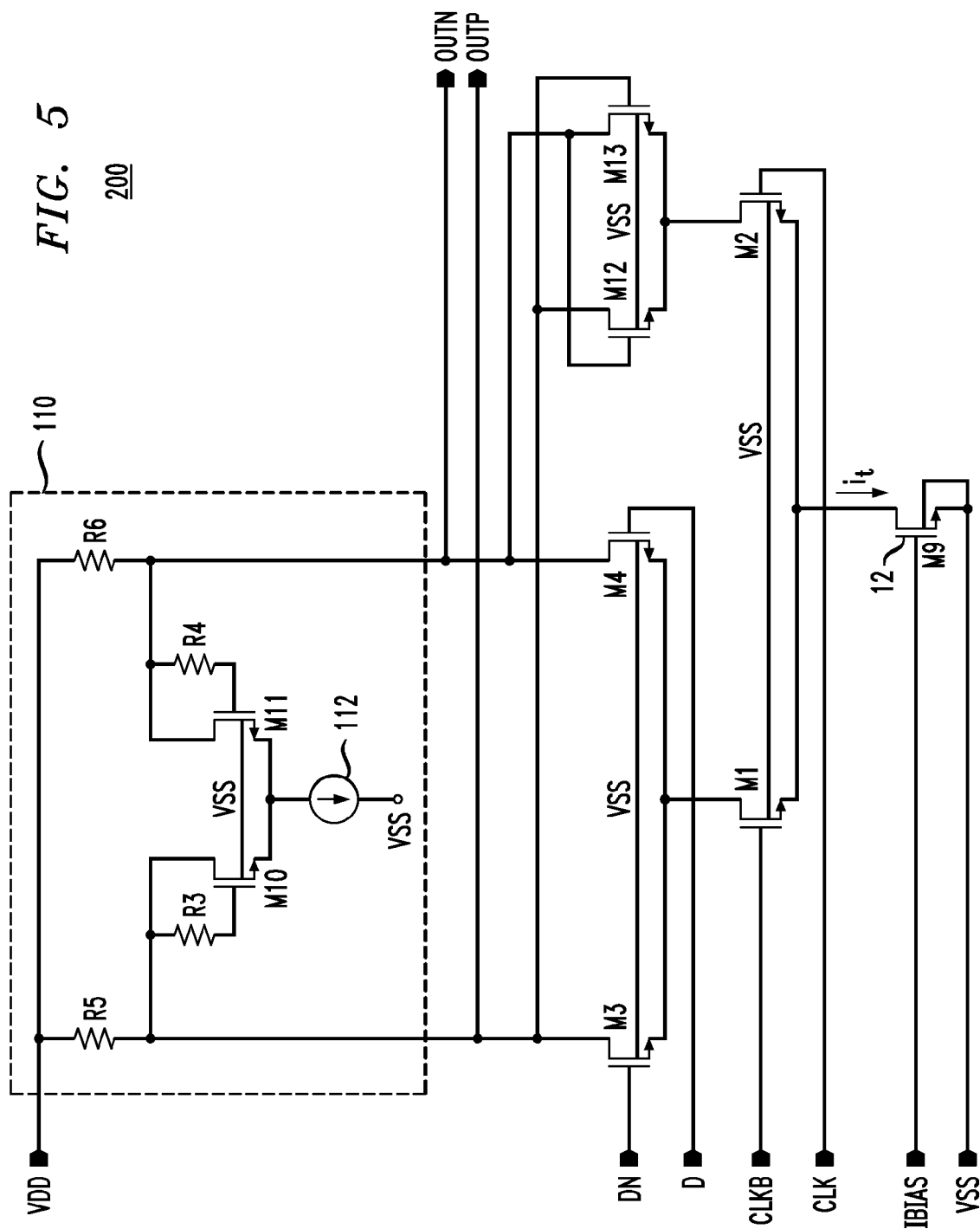
FIG. 5 is a circuit diagram of a CML data latch according to the present invention.

FIG. 5 is a circuit diagram of a CML data latch 200 according to the present invention having a load 110 as described above including a pair of folded active inductors coupled to the output nodes OUTP and OUTN. More specifically, FIG. 5 is a circuit diagram of a falling edge triggered CML D flip-flop. The operation and structure of the data latch 200, as well as modification thereto, should be familiar to those in the art, but are briefly described hereafter. The CML data latch 200 includes a pair of differential outputs OUTP and OUTN coupled to pull up resistors R5 and R6. A tail current source 12 is provided, which may comprise an NMOS transistor M9, for providing constant tail current ($i_t$). The data latch 200 includes a pair of differential transistors M3 and M4 coupled between a selection transistor M1 and nodes OUTP and OUTN, respectively. Transistors M3 and M4 receive data signals data not (DN) and data (D), respectively, and transfer them to the output nodes. The latch 10 also includes a pair of cross-coupled latch transistors M12 and M13 for providing positive feedback.

When signal clock not (CLKB) is on, selection transistor M1 is on, coupling the tail current source 12 to differential pair M3, M4. Selection transistor M2, coupled to latch transistors M12 and M13, receives low signal CLK and is off, disconnecting transistors M12 and M13 from current source 12. Transistors M12 and M13 are off. In this state, the differential pair M3, M4 essentially transfers the data to the outputs. If D is high, meaning DN is low, M4 is on and M3 is off. Node OUTP goes to VDD, as no current flows through resistor R2. Node OUTN goes to a lower voltage (VDD–R6*$i_t$), as the tail current flows through transistor M4.

When CLK is high, M1 is off, disconnecting differential pair M3 and M4 from current source 12. Selection transistor M2 is on. OUTP and OUTN sample the data at the transition time. Whatever data are stored at nodes OUTN and OUTP at this transition time are latched to transistors M12 and M13, respectively. The outputs stay at this data state until the next transition, thereby isolating the output from the input.

Like the multiplexer circuit of FIG. 4, the load 110 includes folded active inductors that help to improve the switching speed of the CML circuit by offsetting parasitic capacitances in the circuit without causing headroom problems associated with conventional active inductors. The common-mode voltage is also well maintained. The entire circuit can also be operated with a 1.0V supply without the need for any high voltage generation circuit. The folded active inductor, therefore, not only consumes lower voltage headroom but also is area-efficient, compared to the conventional active and on-chip spiral inductors, respectively.

Figure 8:
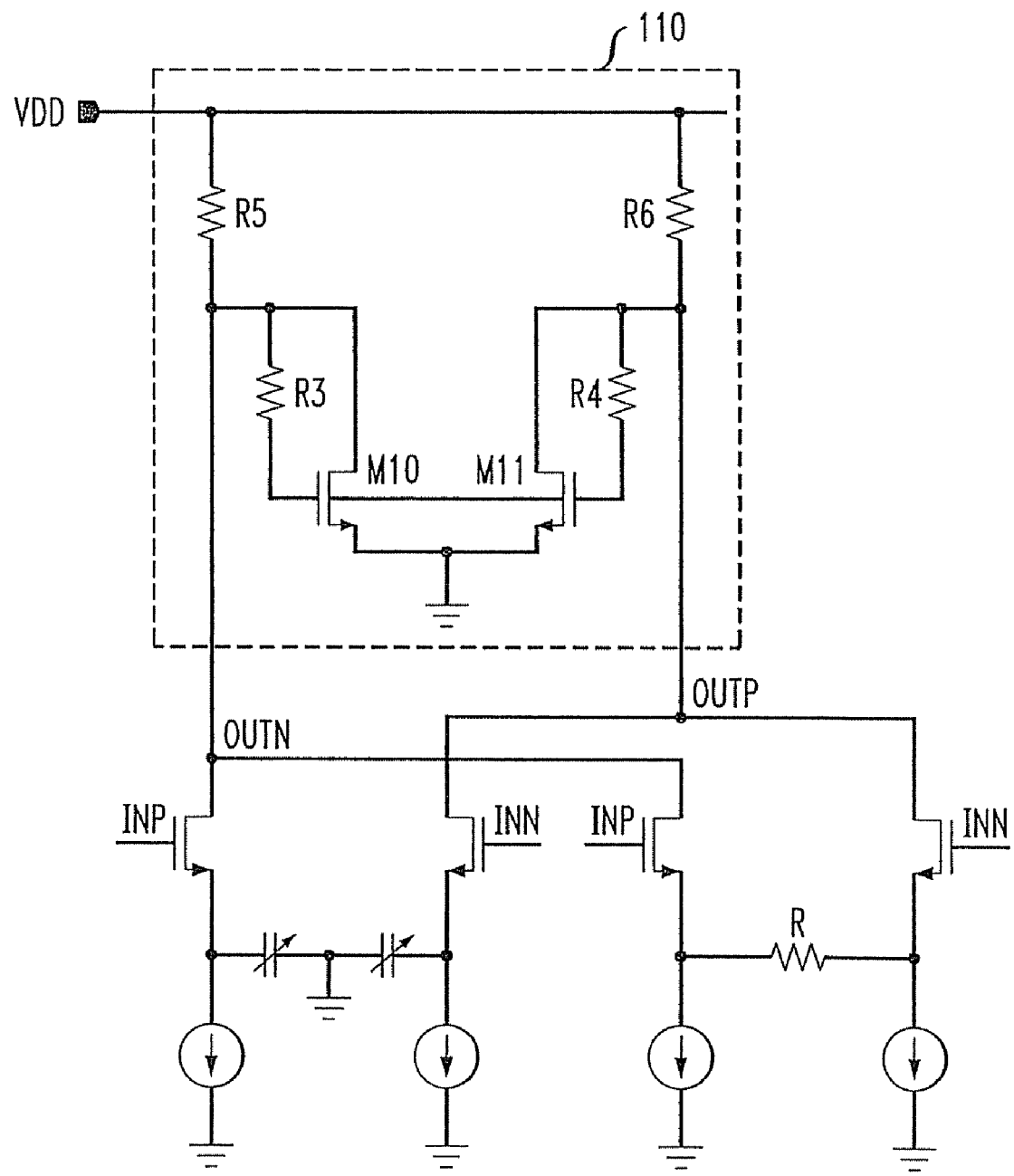
FIG. 8 is a circuit diagram of a CML equalizer circuit according to the present invention having a folded active inductor load.

FIG. 8 is a circuit diagram of a CML equalizer circuit 300 having a folded active inductor load. As with the circuit of FIGS. 4 and 5, the equalizer includes a load comprising folded active inductors including resistor R3 and transistor M10 for the OUTN output node and resistor R4 and transistor M11 for the OUTP output node. The load 110 also includes pull up resistors R5 and R6 coupled between supply rail VDD and the output nodes. The design and operation of the equalizer portion of the circuit 300 are familiar to those in the art and need not be repeated herein.

In this embodiment, the folded active inductor load is used to enhance the equalizer bandwidth as well as to provide further high-frequency boost for equalizing the FR4 backplane channel, i.e., to compensate for the backplane high-frequency loss. The folded active inductor load does not have headroom issues so no on-chip voltage generation circuit using a charge pump is required. The entire equalizer circuit can be under 1.0V supply while consuming very little chip area. Further, the equalizer output common mode voltage can be well maintained.

Figure 9:
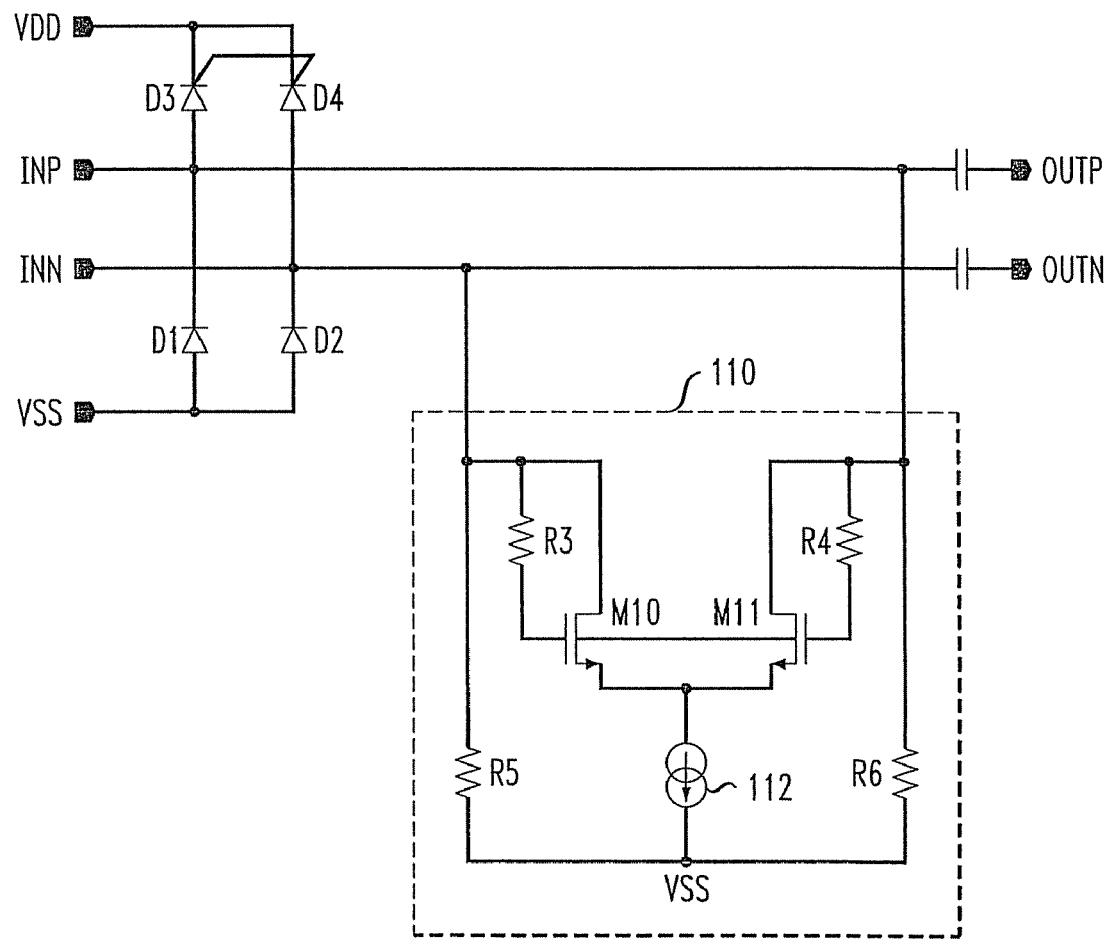
FIG. 9 is a circuit diagram of a SERDES receiver front end according to the present invention having a folded active inductor load.

FIG. 9 is a circuit diagram of the front end 400 of a serializer deserializer (SERDES) receiver having a folded active inductor load. The design and operation of the SERDES receivers and their front ends are familiar to those in the art and need not be repeated herein. As those of ordinary skill in the art will recognize, a SERDES receiver converts data between serial data and parallel interfaces in each direction. A typical SERDES receiver front-end has ESD protection diodes D1 to D4 and 50Ω/75Ω terminated resistors. The input is AC coupled to the receiver. The ESD diodes introduce parasitic capacitance. For high-speed data communication (for example, a 10 Gb/s SERIDES devices), the ESD parasitic capacitance results in bandwidth reduction which cannot be neglected. Such a bandwidth reduction causes ISI (inter-symbol-interference) and degrades the quality of the received signal. Often T-coil inductors are used to compensate for the ESD-induced bandwidth reduction. However, T-coil inductors occupy excessive chip area. The SERDES device 400 uses load 110 having folded active inductors as described above to overcome ESD-induced bandwidth reduction. This approach occupies very little chin area. It is also easy to tune the inductance value. Often the ESD model is very inaccurate. The inductance tuning allows optimal compensation of ESD-induced bandwidth reduction.

It should be noted that with the active inductor embedded in the ESD protection circuit, in designing the receiver 50Ω/75Ω termination network, one should also consider the effective resistance of the added active inductor, that is, to make the $(1/g_m//R_{load})$ to be 50 Ω/75Ω, rather than make the $R_{load}$ itself to be 50Ω/75Ω. However, as often the case $1/g_m$ is much larger than 50Ω/75Ω, so practically it has very little impact on the terminated resistance value.

The inductance value can be easily programmed by changing the tail current in the active inductor load or changing the devices W/L sizes (the M10 and M11 sizes). The changing/programming can be done through on-chip register control bits. For example, the tail current of the active inductor load can be binary weighted and be switched on/off via an on-chip microcontroller. Often the ESD model is not very accurate and thus it is difficult for a circuit designer to design the ESD compensation circuit optimally. The inductance programmable capability can solve this problem, allowing optimal compensation of ESD-induced bandwidth reduction during lab characterization.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A current mode logic digital circuit comprising:
a logic circuit component having at least a first pair of differential input nodes and a pair of differential output nodes;
a tail current source coupled to said logic circuit component; and
a load coupled between a power supply node and at least one of said pair of differential output nodes, said load comprising a folded active inductor coupled to said at least one differential output node,
wherein said load comprises a pull up resistor coupled between said power supply node and said at least one differential output node and wherein said folded active inductor is coupled between said at least one differential output node and said ground node, and
wherein said folded active inductor comprises a MOS transistor coupled between said at least one differential output node and said ground node and a second resistor coupled between said at least one differential output node and a gate terminal of said MOS transistor.

2. The circuit of claim 1, further comprising a current source coupled between said MOS transistor and said ground node.

3. The circuit of claim 1, wherein said logic circuit component includes a circuit selected from the group consisting of a multiplexer, an AND gate, an OR gate, a data buffer, a XOR gate, a data latch, and a flip-flop.

4. The circuit of claim 1,
wherein said load comprises first and second folded active inductors coupled to said differential output nodes.

5. The circuit of claim 4, wherein said logic circuit component comprises a data latch, said logic circuit component comprising a first circuit module comprising a first pair of differential transistors coupled to said first pair of differential input nodes and coupled between said differential output nodes and a tail current source, and a second circuit module comprising a pair of cross-coupled transistors coupled between said differential output nodes and said tail current source.

6. The circuit of claim 1,
wherein said logic circuit component comprises at least first and second pairs of differential inputs nodes and a pair of differential output nodes,
wherein said load comprises first and second folded active inductors coupled to said differential output nodes, and
wherein said logic circuit component comprises a multiplexer, said logic circuit component comprising a first pair of differential transistors for receiving first data differential inputs and coupled between said output nodes and a tail current source, and a second pair of differential transistors for receiving second data differential inputs and coupled between said output nodes and said tail current source.

7. The circuit of claim 1, wherein said logic circuit component is an equalizer.

8. The circuit of claim 1, wherein said logic circuit component comprises a front end of a serializer-deserializer, said front end comprising a diode ESD protection device.

9. A current mode logic digital circuit comprising:
a logic circuit component having at least a first pair of differential input nodes and a pair of differential output nodes;
a tail current source coupled to said logic circuit component; and
a load, said load comprising a pull up resistor coupled between a first power supply node and said at least one differential output node and a folded active inductor coupled between said at least one differential output node and a second power supply node, said folded active inductor comprising a MOS transistor and a second resistor, said second resistor being coupled between said at least one differential output node and gate terminal of said MOS transistor, said MOS transistor have a pair of source/drain terminals, a first one of said source/drain terminals coupled to said at least one differential output node and a second one of said source/drain terminals coupled to said second power supply node.

10. The circuit of claim 9, further comprising a current source coupled between said MOS transistor and said second power supply node.

11. The circuit of claim 9, wherein said logic circuit component includes a circuit selected from the group consisting of a multiplexer, an AND gate, an OR gate, a data buffer, a XOR gate, a data latch, and a flip-flop.

12. The circuit of claim 9,
wherein said logic circuit component comprises at least a first pair of differential input nodes and a pair of differential output nodes, and
wherein said load comprises first and second folded active inductors coupled to said differential output nodes.

13. A current mode logic digital circuit comprising:
a logic circuit component comprising circuit structure for implementing a logic function, said logic circuit component comprising at least one pair of differential input nodes and a pair of differential output nodes;
a tail current source coupled to said logic circuit component; and
first and second loads coupled to said output nodes, each load comprising:
a pull up resistor coupled between a power supply node and a respective output node and a folded active inductor coupled between said respective output node and a ground node, said folded active inductor comprises a MOS transistor coupled between said respective output node and said ground node and a second resistor coupled between said respective output node and a gate terminal of said MOS transistor.

14. The circuit of claim 13, further comprising a current source coupled between said MOS transistors and said ground node.

15. The circuit of claim 13, wherein said logic circuit component includes a circuit selected from the group consisting of a multiplexer, an AND gate, an OR gate, a data buffer, a XOR gate, a data latch, and a flip-flop.

16. The circuit of claim 13, wherein said logic circuit component comprises a first circuit module and a second circuit module cooperating to implement said logic function, said circuit further comprising first and second selection transistors disposed between said circuit modules and said tail current source for selectively coupling said circuit modules to said tail current source.

17. The circuit of claim 13, wherein said tail current source comprises a NMOS transistor.

* * * * *